(12) United States Patent
Hooper

(10) Patent No.: US 10,523,199 B2
(45) Date of Patent: Dec. 31, 2019

(54) HOUSINGS FOR INDUCTIVE PROXIMITY SENSORS

(76) Inventor: Robert Hooper, Burlington (CA)

( * ) Notice: Subject to any disclaimer, the term of this patent is extended or adjusted under 35 U.S.C. 154(b) by 250 days.

(21) Appl. No.: 13/331,077

(22) Filed: Dec. 20, 2011

(65) Prior Publication Data

US 2013/0154669 A1   Jun. 20, 2013

(51) Int. Cl.
*H03K 17/95* (2006.01)
*G01D 1/00* (2006.01)
*G01D 3/00* (2006.01)

(52) U.S. Cl.
CPC ................................ *H03K 17/9505* (2013.01)

(58) Field of Classification Search
CPC .. G01D 1/00; G01D 3/00; G01D 4/00; G01D 5/00; G01B 1/00; G01B 2210/00
USPC .......................................................... 324/654
See application file for complete search history.

(56) References Cited

U.S. PATENT DOCUMENTS

| | | | |
|---|---|---|---|
| 5,264,733 A * | 11/1993 | Tigges | 307/116 |
| 5,532,591 A * | 7/1996 | Logue | 324/242 |
| 5,648,719 A * | 7/1997 | Christensen et al. | 324/207.26 |
| 5,801,530 A * | 9/1998 | Crosby et al. | 324/207.26 |
| 6,299,534 B1 * | 10/2001 | Breeding et al. | 463/25 |
| 2005/0212510 A1 * | 9/2005 | Kirchdoerffer et al. | 324/207.15 |
| 2007/0001667 A1 * | 1/2007 | Kirchdoerffer .... H03K 17/9505 | 324/207.15 |
| 2007/0188163 A1 * | 8/2007 | Jagiella ................ G01D 11/245 | 324/207.15 |
| 2010/0223982 A1 * | 9/2010 | Siraky ................. F15B 15/2861 | 73/114.28 |
| 2011/0101967 A1 * | 5/2011 | Kayserman et al. .... 324/207.15 |  |
| 2012/0092002 A1 * | 4/2012 | Kleegrewe ........... G01D 5/2006 | 324/207.16 |
| 2013/0021029 A1 * | 1/2013 | Hoenicka ........... H03K 17/9505 | 324/258 |
| 2013/0154669 A1 * | 6/2013 | Hooper ............. H03K 17/9505 | 324/654 |

* cited by examiner

*Primary Examiner* — Huy Q Phan
*Assistant Examiner* — Temilade S Rhodes-Vivour
(74) *Attorney, Agent, or Firm* — Laurence P. Colton; Smith Tempel Blaha LLC

(57) ABSTRACT

Inductive Proximity Sensors are non-contact sensing devices used in manufacturing processes to sense metal targets. In practice, it is common for objects to contact the sensor causing the sensor to malfunction. An inductive sensor with improved durability is required. An inductive proximity sensor includes an exterior housing, an interior sensing coil and electronic circuit, and a connector. The Exterior housing is produced from one piece of metal bar, bored from one end to the tip of the other end, leaving the cylindrical tube open only on one end. The Exterior Housing is produced with an Inside Dimension that is smaller than previous proximity sensors and places the coil and electronic circuit further away from the Outside Dimension of the Exterior Housing. The interior sensing coil and electronic circuit are protected by the thick casing of the Exterior housing to improve structural rigidity and the longevity of operation in manufacturing processes. The design of the Exterior Housing has the ability to withstand extreme shear forces from contact abuse.

16 Claims, 4 Drawing Sheets

Exterior Housing of Inductive Proximity Sensor

Figure 1. Exterior Housing of Inductive Proximity Sensor
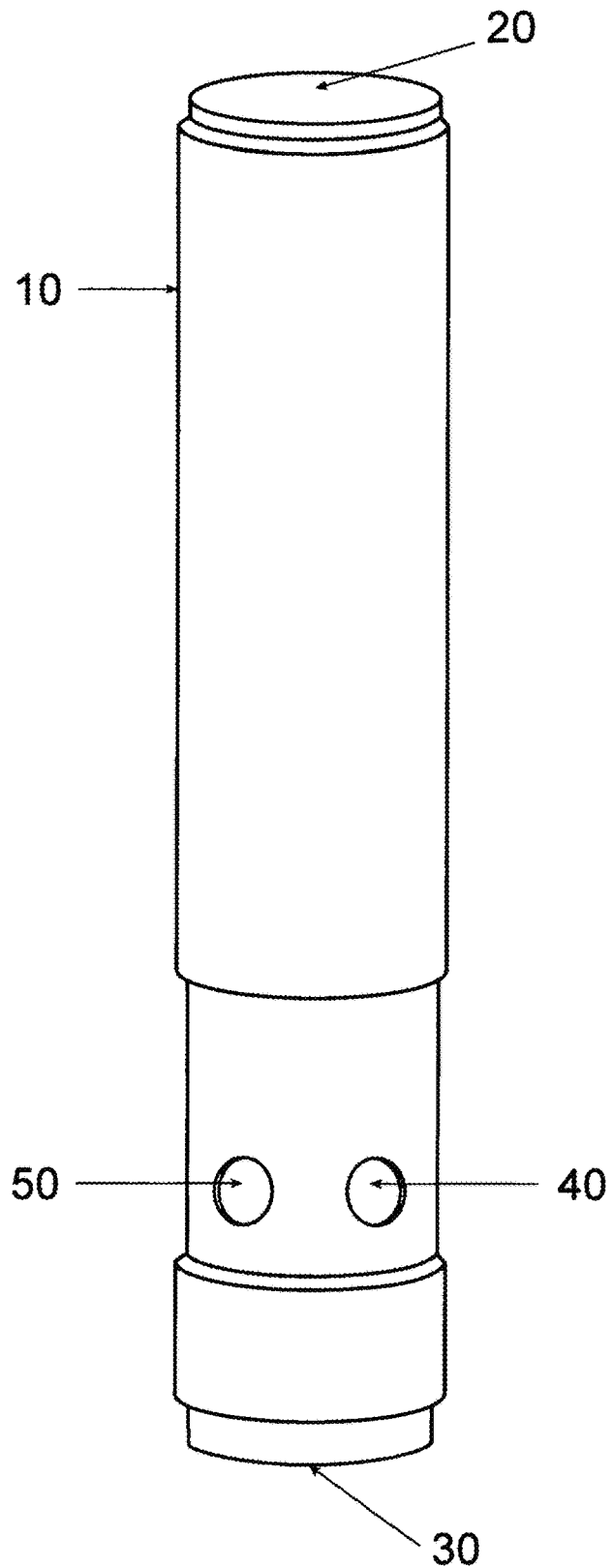

Figure 2a. Cross Section of Exterior Housing of Inductive Proximity Sensor
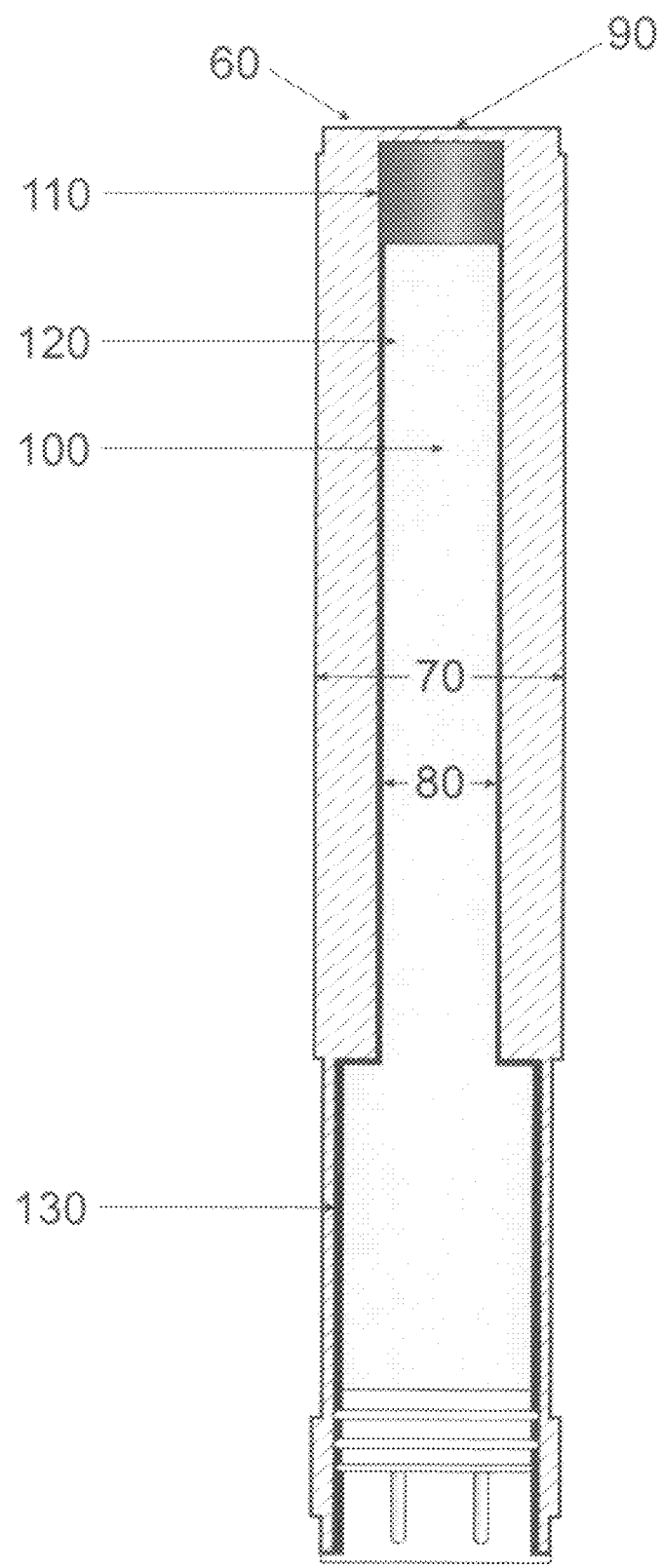

Figure 3. Cross Section – Sensing Portion of Exterior Housing of Inductive Proximity Sensor
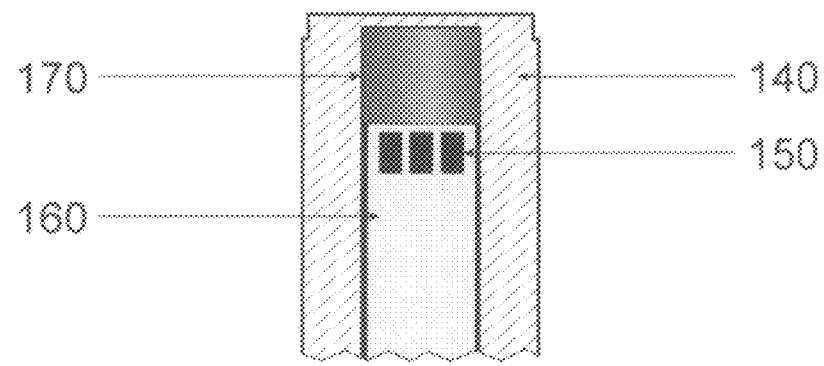

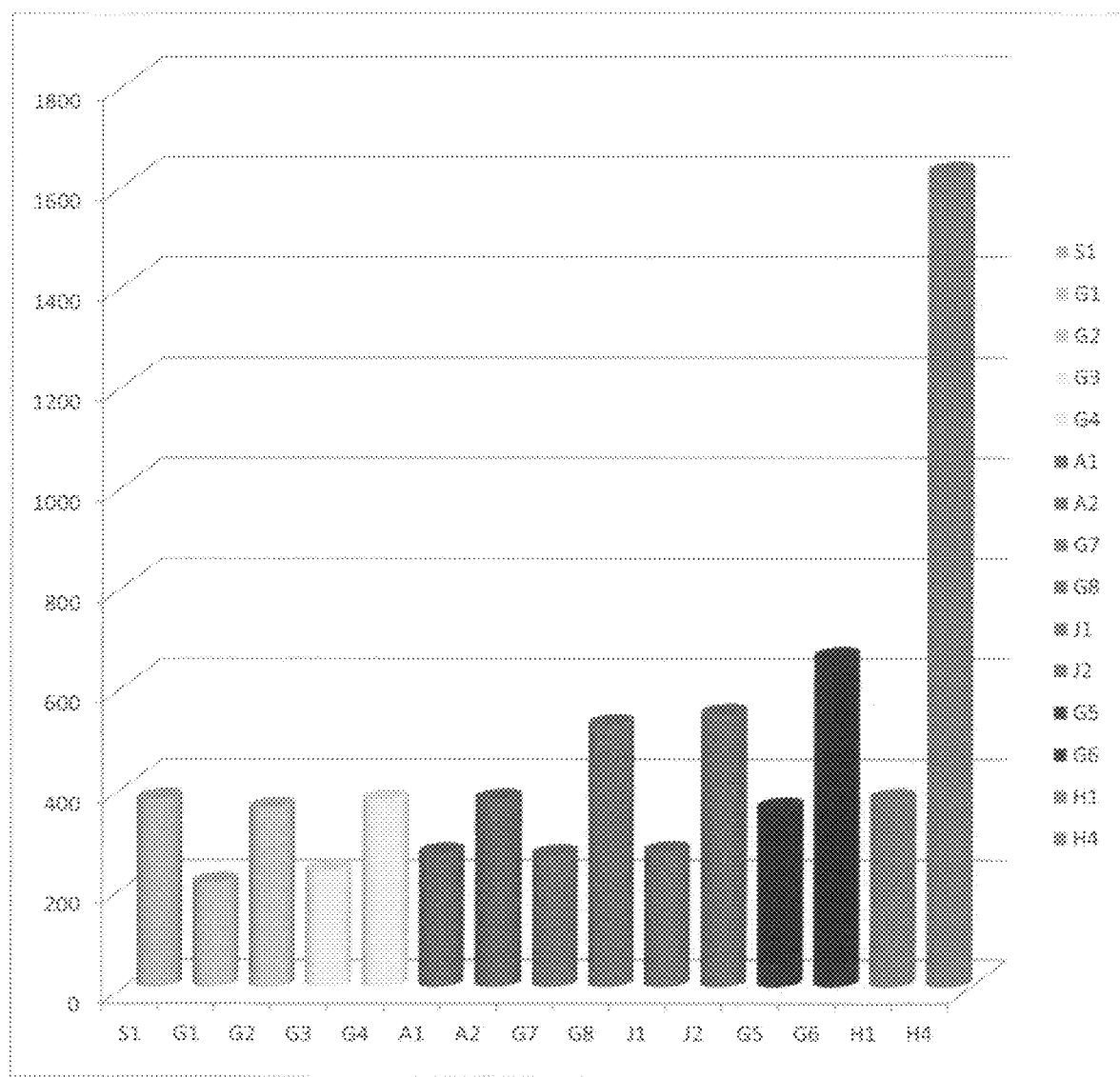
Figure 4: Results of Shear Testing

HOUSINGS FOR INDUCTIVE PROXIMITY SENSORS

TECHNICAL FIELD

The present invention generally relates to inductive proximity sensors and, more specifically, to the Exterior Housing construction of inductive proximity sensors, in order to improve upon the structural rigidity and durability of the sensor to prevent breakage from contact with other objects by greatly increasing the amount of casement material in the Exterior Housing.

BACKGROUND

Inductive proximity sensors are non-contact sensing devices that are used in a wide variety of manufacturing processes to sense the presence of metal objects. Proximity sensors contain a sensing coil, and an electronic sensing circuit, and once connected to electricity; the sensor generates a magnetic field emanating from the active sensing face. As a metal object enters into the range of the proximity sensor, the magnetic field is disrupted, and this disruption to the magnetic field is detected by the sensing circuit of the sensor. Inductive proximity sensors are particularly useful in stamping dies, automated welding processes; automated assembly machines and packaging machinery, where moving metal parts are integral to production.

In order to obtain a repeatable manufacturing process, machines need to verify the placement of objects in close relation to the optimally designed location. For this reason, inductive proximity sensors are particularly useful due to their repeatable, albeit short range. Common inductive proximity sensors have a sensing range of only a few millimeters from the active sensing face. For instance, common 12 mm diameter inductive proximity sensors have a sensing range of only 4 mm from the active sensing face to the edge of the detectable magnetic field. This short range is optimal for repeatable manufacturing processes, since the sensor only sends an output to the logic controller once the metal target is within this short range. However, this short range also makes it common for the active sensing face to be contacted by the metal target, or by moving debris in close relation to the sensing area. As a result, inductive proximity sensors must be replaced often, which causes costly downtime to machinery.

In order to increase the working lifespan of inductive proximity sensors it is common practice to produce an Exterior Housing with an interior diameter only slightly smaller than the outside diameter of the Exterior Housing casing. By using a very large interior diameter, it is possible to use a larger sensor coil, which can produce a larger magnetic field and longer effective sensing range. The longer sensing range could keep the active sensing face at a greater distance to the target material, however, the sensing range is only improved by a few millimeters and contact with the sensing face is still common.

In order to increase the durability of the active sensing face, it is common to use a cap or cover over the active sensing face made of ceramic, plastic, Teflon or other materials. By using a non-metallic cover over the sensing face, the sensing range can be improved, since a metallic sensing face could adversely affect the potential sensing range because of effects to the magnetic field produced by the sensing coil when passing through the metal sensing face. These non-metallic materials can improve sensor longevity because they can withstand impacts from metal objects better than a typical plastic sensor face cover. However, these types represent a two piece construction, where one piece is the metal Exterior Housing, and the other piece the sensing face cover. This produces a weaker structural construction than may be obtained from a one piece construction, and these types can still break easily due to heavy force, or repeated contacts.

In order to improve on the durability of inductive proximity sensors, it has been proposed to recess the active sensing face from the tip of the Exterior Housing in order to reduce contact to the active sensing face or to position the sensing coil at a distance from the Exterior Housing using a protective annulus placed between the sensing coil and the outer edge of the housing. Also the coil could be surrounded by an air gap, or other material having a low magnetic permeability relative to the Exterior Housing. This allows for some protection from contact while preserving the sensing range, however, a structural disadvantage exists compared to an all metal one piece construction of the Exterior Housing.

Accordingly, a need exists to improve upon the Exterior Housing construction of inductive proximity sensors.

SUMMARY

The goal underlying the present invention is to produce an inductive proximity sensor with an Exterior Housing that is structurally more durable and resistant to breakage than previous art. Conventional inductive proximity sensors have a large sensing coil relative to the exterior diameter of the sensor using thin metal sidewalls, so that a maximum sensing range can be achieved.

This invention reduces the ability to maximize the sensing range, since the sidewalls are so thick only a much smaller sensor coil may be used, but instead, improves the structural integrity of the Exterior Housing by using a very small interior diameter relative to the Exterior Housing, such that the Exterior Housing can withstand contact from target metals or other debris.

In accordance with the advantageous features of the present invention, an inductive proximity sensor is provided with an Exterior Housing that is produced from one piece of metal, flat on the active sensing surface, and bored out from the connector end, with a very thick casing represented by the exterior dimension and interior dimension of the Exterior Housing in order to maximize structural rigidity, and to improve the longevity of inductive proximity sensors in automated processes.

The present invention is designed to withstand large forces from impact from tools, parts, and machinery while in operation. Third party, independent, lab testing confirms the massive increase in shear load force that can be applied to the present invention, relative to any previously considered proximity sensor. The advantage of withstanding high shear forces is to last longer in operation and reducing the time to replace sensors in operation, to save the user time and expense of replacing weaker sensors.

BRIEF DESCRIPTION OF THE DRAWINGS

FIG. 1 Depicts the Exterior Housing of an inductive proximity sensor, indicating the various elements of the Housing including the sensing portion, the connector portion, the active sensing face, and other elements described above.

FIG. 2 Depicts a cross-sectional view of the Exterior Housing of the inductive proximity sensor in FIG. 1 indicating the various inside and outside dimensions described above.

FIG. 3 Depicts a cross-sectional view of the Exterior housing of the inductive proximity sensor in FIG. 1 indicating the various components of the interior parts that make up the inductive proximity sensor.

FIG. 4 Depicts the bar graph obtained by a third party, independent test lab, that shows the relative shear forces used on similar sensors, and the massive advantage created by the design of the present invention.

DETAILED DESCRIPTION OF THE DRAWINGS

FIG. 1 depicts an inductive proximity sensor comprising an Exterior Housing (10) made of one piece of metal that may be threaded for fixing mounting nuts, or unthreaded for use in a clamp or other attachment. On the closed end is a flat sensing face portion (20), where the sensor coil is located on the inside of the housing. On the open end of the Exterior Housing (10) is the connector end (30), where the interior is bored out to produce a hollow cavity by which the sensing coil, sensing circuit and sensor connector may be inserted.

The Exterior Housing has 5 holes drilled in the side of the Housing. One hole (40) is for final assembly of the inductive proximity sensor where an epoxy substance is injected into the housing, in order to provide protection to the electronic parts inside the housing. The other hole (50) is to view the internal LED which signals output and power functions for the operation of the inductive proximity sensor. There could be multiple such holes in the Exterior Housing, in order to make it easier to view the LED output function, or to make it easier to inject epoxy for final assembly. The connector end (30) is shown with a rigid connector, which may be threaded or unthreaded for a successful connection to a connector cable. The connector end (30) could also be sealed with epoxy, with an integrated cable protruding from the Exterior Housing.

FIG. 2 depicts a cross-sectional view of an inductive proximity sensor Exterior Housing (60) indicating the Exterior Diameter (70) and the Interior Diameter (80), in order to depict the sidewall thickness of the invention. In conventional proximity sensors, the sidewall thickness is intentionally thin, so as to maximize the size of the Interior Diameter, such that a larger sensing coil may be used that can purposefully extend the potential sensing range in order to keep the target metal object at a longer distance from the active sensing face (90).

The hollow interior of the Exterior Housing (100), is where the sensing circuit is placed, in order to provide electronic function to the inductive proximity sensor. The sensing coil (110), is placed at the end of the interior of the Exterior Housing, at the closed end of the interior of the Exterior Housing of the proximity sensor.

The hollow interior of the sensing portion (120) of the Exterior Housing is uniform in diameter. The hollow cavity is produced by boring out the cavity from the other end, so as to maximize the rigidity of the Exterior Housing, as opposed to conventional proximity sensors which use a tubular metal body, and plastic cap or cover over the active sensing face on the one open end, and a connector on the other open end. The one-piece construction of this invention provides improved structural strength, since there are no joints or seams, and provides protection from ingress of liquids that a 2-piece joined construction does not provide.

The added thickness of the Exterior Housing provides a unique and novel increase to the structural rigidity of the inductive proximity sensor as evidenced by shear load testing.

The hollow interior of the connector portion (130) of the Exterior Housing may be wider than the interior of the sensing portion (120) of the Exterior Housing in order to accommodate a connector insert, designed to connect the inductive proximity sensor to a connector or cable for power and output function.

FIG. 3 depicts a cross-sectional view of the inductive proximity sensor (140), in order to illustrate the position of the interior components that provide function to the proximity sensor. The sensor circuit (150) is placed in the interior of the Exterior Housing (160), by pushing it through the one open end of the cylindrical housing. The sensor circuit holds the various components necessary to provide input power and output function to the sensor, in order to function as an inductive proximity sensor.

The sensor coil (170) is placed at the very end of the interior of the Exterior Housing. Due to the uniform diameter tubular shape of the interior of the Exterior Housing, there are no air gaps, or any zone having a lower magnetic permeability relative to the sensor housing as in some previous inductive proximity sensor models. The sensing coil (170), comprises a copper winding bobbin, housed within a ferrite core, or plastic carrier, such that the sensing coil is encased within the Exterior Housing, with no barriers between the coil assembly and the interior metal of the sensor body.

FIG. 4 depicts a bar graph of the results of third party, independent lab testing for shear strength of the Exterior Housings of the most famous manufacturers in the world for similar proximity sensors. Testing included samples from a manufacturer in Switzerland, 4 manufacturers in Germany, and the leading manufacturers in Japan and the United States. All of these samples were made of stainless steel, or chrome plated brass. Each manufacturer was tested with a 2-piece housing made of metal with a plastic face, and also with a 1-piece full stainless steel face and body construction. In every case, the sample with the 1-piece housing tested with a higher shear force load than the 2-piece sample from each manufacturer. In the final bar on the graph, is the shear force results of the present invention. The present invention was tested to withstand between double, and up to 7 times more shear force than any other sensor. The test was performed using a standard mounting of the sensor 30 mm from the sensing end. A shear force was then applied to the end of the sensor until it failed at a speed of 0.5 inches per minute. The peak hold value was captured at the time of failure and repeated across all samples. The testing machine was operated in accordance with ASTM A370-14 Paragraph 8, by a third party, independent test lab. The present invention was able to withstand over 1600 lbf of shear force at the peak hold maximum load, which was more than double any other sample, and seven times more than a typical proximity sensor with a metal body joined to a plastic sensing face.

The above descriptions and diagrams are meant to represent examples of the invention. While it is not possible to describe every conceivable combination of components, and every possible slight variation to the above invention, one of ordinary skill in the art will recognize the unique features and benefits this invention provides, and that slight variations, combinations and permutations are possible, however, this invention is intended to embrace all such changes or additions within the scope of the claims provided.

What is claimed is:

1. An inductive proximity sensor comprising:
    an elongated cylindrical exterior housing being a hollow cylinder having two spaced apart ends, one of the spaced apart ends being an open end, and the other of the spaced apart ends being a closed end, the exterior housing being made of one piece of material, the exterior housing having an outside dimension, and the hollow cylinder having an inside dimension;
    a sensing face within the hollow cylinder at the closed end of the exterior housing;
    a connector to electrical power and output connections within the hollow cylinder at the open end of the exterior housing;
    a sensor coil within the hollow cylinder at the closed end of the exterior housing and opposite the open end of the exterior housing, with no air gaps or any other annulus or material between the sensor coil and the exterior housing; and
    an inductive proximity sensor circuit located within the hollow cylinder, one end of the inductive proximity sensor circuit being connected to the connector and another end of the inductive proximity sensor circuit being connected to the sensor coil;
    wherein the inside dimension of the hollow cylinder is approximately one-half of the exterior dimension of the exterior housing whereby the exterior housing has a sidewall with a thickness to provide increased structural rigidity and protection to components within the hollow cylinder from contact to the exterior housing.

2. The inductive proximity sensor of claim 1, wherein the outside dimension of the exterior housing has an outside diameter of 18 mm and the inside dimension of the hollow cylinder has an inside diameter no larger than 9.5 mm.

3. The inductive proximity sensor of claim 1, wherein the outside dimension of the exterior housing has an outside diameter of 12 mm and the inside dimension of the hollow cylinder has an inside diameter no larger than 6 mm.

4. The inductive proximity sensor of claim 1, wherein the outside dimension of the exterior housing has an outside diameter of 8 mm and the inside dimension of the hollow cylinder has an inside diameter no larger than 3.5 mm.

5. The inductive proximity sensor of claim 1, wherein the inside dimension of the hollow cylinder at the open end can be wider than the inside diameter of the hollow cylinder at the closed end depending on the size of the connector used.

6. The inductive proximity sensor of claim 1, wherein the material of the exterior housing is a metal selected from the group consisting of steel, stainless steel, tool steel, aluminum, and brass.

7. The inductive proximity sensor of claim 1, wherein the material of the exterior housing is a non-metal material selected from the group consisting of plastics, ceramics, silicones, carbon fiber, and wood.

8. The inductive proximity sensor of claim 1, wherein the hollow cylinder of the exterior housing is made using a process selected from the group consisting of milling, boring, casting, and injection molding.

9. The inductive proximity sensor of claim 1, wherein the exterior housing is made of two pieces of the same material joined to produce the one piece of material.

10. The inductive proximity sensor of claim 1, wherein the sensing coil is not separated from the exterior housing by a zone having a different magnetic permeability relative to the exterior housing.

11. The inductive proximity sensor of claim 1, wherein the exterior housing is threaded, whereby the inductive proximity sensor is attachable with locking nuts.

12. The inductive proximity sensor of claim 1, wherein the exterior housing is non-threaded, whereby the inductive proximity sensor is attachable with non-threaded fasteners selected from the group consisting of clamps, tie rods, and non-threaded fasteners.

13. The inductive proximity sensor of claim 1, wherein the connector is selected from the group consisting of a connector plug with either male or female connections, and an integrated cable for providing the same means of transmitting electrical power or output functions to and/or from the proximity sensor circuit.

14. The inductive proximity sensor of claim 1, wherein the elongated cylindrical exterior housing further includes a hole positioned proximate the open end to allow injection of epoxy into the elongated cylindrical exterior housing for final assembly.

15. The inductive proximity sensor of claim 1, further comprising an LED operatively coupled inside the elongated cylindrical exterior housing for signaling output and power functions of the inductive proximity sensor.

16. The inductive proximity sensor of claim 15, wherein the elongated cylindrical exterior housing further includes a hole positioned proximate the open end to allow the LED to be viewed from the outside when operating.

* * * * *